United States Patent
Said et al.

(10) Patent No.: US 10,455,247 B2
(45) Date of Patent: Oct. 22, 2019

(54) METHOD AND APPARATUS FOR PERFORMING ARITHMETIC CODING ON BASIS OF CONCATENATED ROM-RAM TABLE

(71) Applicant: LG ELECTRONICS INC., Seoul (KR)

(72) Inventors: Amir Said, San Jose, CA (US); Abo Talib Mahfoodh, San Jose, CA (US)

(73) Assignee: LG Electronics Inc., Seoul (KR)

( * ) Notice: Subject to any disclaimer, the term of this patent is extended or adjusted under 35 U.S.C. 154(b) by 181 days.

(21) Appl. No.: 15/322,875

(22) PCT Filed: Jun. 29, 2015

(86) PCT No.: PCT/KR2015/006622
§ 371 (c)(1),
(2) Date: Dec. 29, 2016

(87) PCT Pub. No.: WO2016/003131
PCT Pub. Date: Jan. 7, 2016

(65) Prior Publication Data
US 2017/0142437 A1    May 18, 2017

Related U.S. Application Data

(60) Provisional application No. 62/018,645, filed on Jun. 29, 2014.

(51) Int. Cl.
*H04N 19/13* (2014.01)
*H04N 19/50* (2014.01)
(Continued)

(52) U.S. Cl.
CPC .......... *H04N 19/50* (2014.11); *H03M 7/4012* (2013.01); *H03M 7/42* (2013.01); *H04N 19/13* (2014.11); *H04N 19/184* (2014.11)

(58) Field of Classification Search
None
See application file for complete search history.

(56) References Cited

U.S. PATENT DOCUMENTS

| 7,262,722 B1 | 8/2007 | Jahanghir |
| 7,982,641 B1 | 7/2011 | Su |

(Continued)

FOREIGN PATENT DOCUMENTS

| JP | 2003188736 A | 7/2003 |
| JP | 2005525018 A | 1/2006 |

(Continued)

OTHER PUBLICATIONS

Said A. Introduction to arithmetic coding-theory and practice. Hewlett Packard Laboratories Report. Apr. 21, 2004:1057-7149. (Year: 2004).*

(Continued)

*Primary Examiner* — Clifford Hilaire
(74) *Attorney, Agent, or Firm* — Fish & Richardson P.C.

(57) ABSTRACT

Disclosed herein is a method of performing an arithmetic decoding for data symbols, comprising: creating a decoding table index; obtaining an upper bound value and a lower bound value of a ratio between an interval length and a point within an interval assigned to a symbol from a ROM table; obtaining initial values for a bisection search from a RAM table based on the upper bound value and the lower bound value; and searching a value of sequence in the interval, wherein the interval is determined based on the initial values.

8 Claims, 11 Drawing Sheets

(51) Int. Cl.
*H04N 19/184* (2014.01)
*H03M 7/40* (2006.01)
*H03M 7/42* (2006.01)

(56) References Cited

U.S. PATENT DOCUMENTS

2003/0023919 A1* 1/2003 Yuan ................. H03M 13/2975
714/755
2004/0117714 A1 6/2004 Marpe
2012/0323983 A1 12/2012 Pi et al.

FOREIGN PATENT DOCUMENTS

| JP | 2013517519 A | 5/2013 |
|---|---|---|
| KR | 20060109243 A | 10/2006 |
| KR | 10-2010-0136896 | 12/2010 |
| KR | 10-2011-0021325 | 3/2011 |
| KR | 10-2013-0050904 | 5/2013 |
| WO | WO2004028165 A | 4/2004 |
| WO | WO2013046504 A | 4/2013 |

OTHER PUBLICATIONS

Shojania H, Sudharsanan S. A high performance CABAC encoder. InIEEE-NEWCAS Conference, 2005. The 3rd International Jun. 19, 2005 (pp. 315-318). IEEE. (Year: 2005).*
Doshi J, Gandhi S. Computing Number of Bits to be processed using Shift and Log in Arithmetic Coding. International Journal of Computer Applications. Jan. 1, 2013;62(15). (Year: 2013).*
Extended European Search Report in European Application No. 15815747.9, dated Feb. 5, 2018, 11 pages.
Amir Said, "Introduction to Arithmetic Coding—Theory and Practice," Hewlett Packard Laboratories Report, Apr. 21, 2004, XP055251135, 67 pages.
Xie et al., "A code decompression architecture for VLIW processors," 34th ACM/IEEE International Symposium on Microarchitecture, Dec. 1, 2001, pp. 66-75.
Itu-T, "Series H: Audiovisual and Multimedia Systems Infrastructure of audiovisual services—Coding of moving video," H. 265: High efficiency video coding. Recommendation ITU-T H.265, Apr. 2013, 315 pages.
Said, "Comparative Analysis of Arithmetic Coding Computational Complexity," IEEE Data Compression Conference, Snowbird, Utah, USA, Mar. 23-25, 2004, pp. 1-21.

* cited by examiner

[Figure 1]
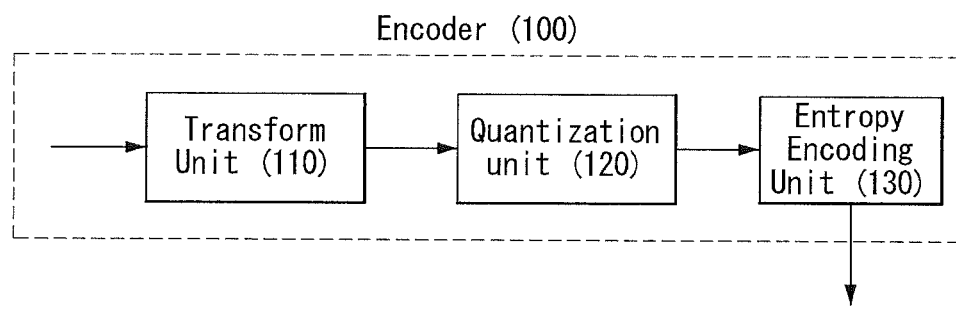

[Figure 2]
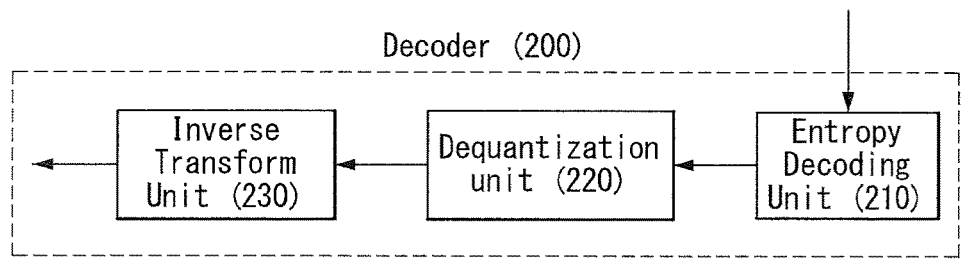

[Figure 3]
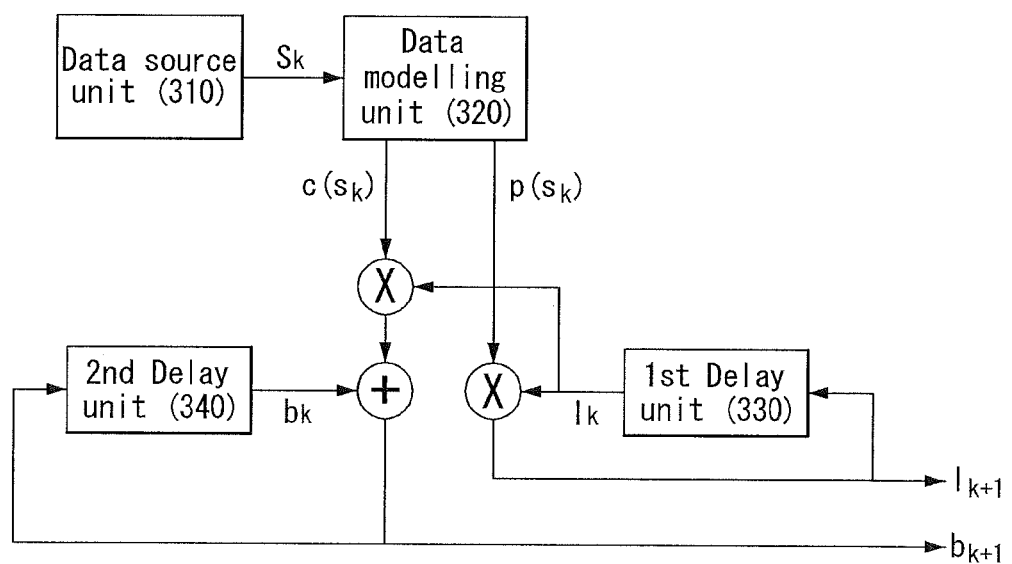

[Figure 4]
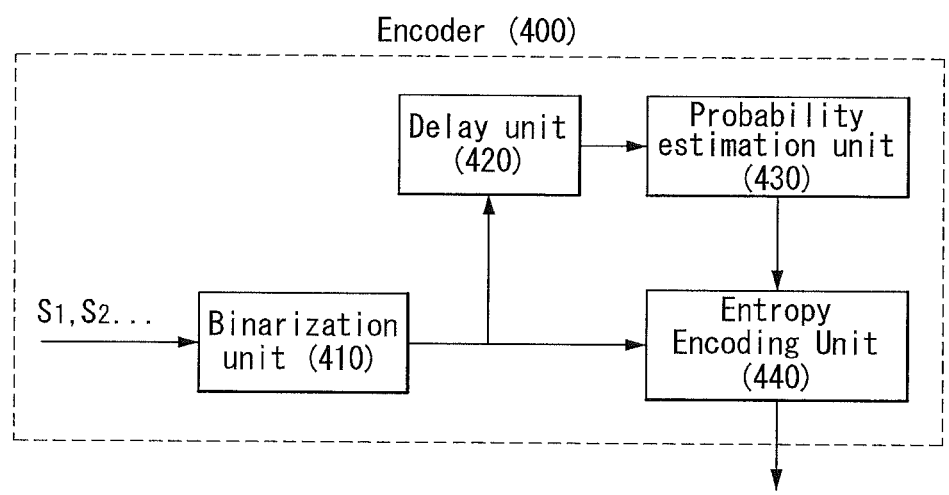

[Figure 5]
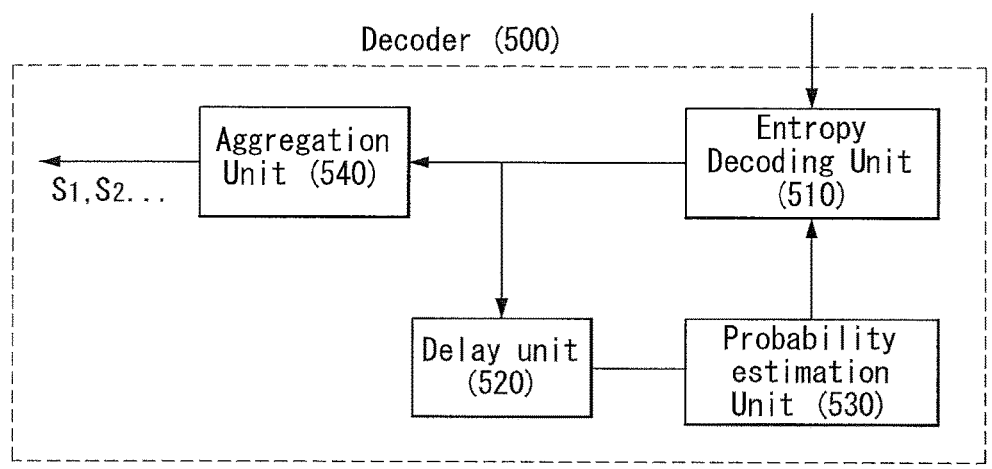

[Figure 6]
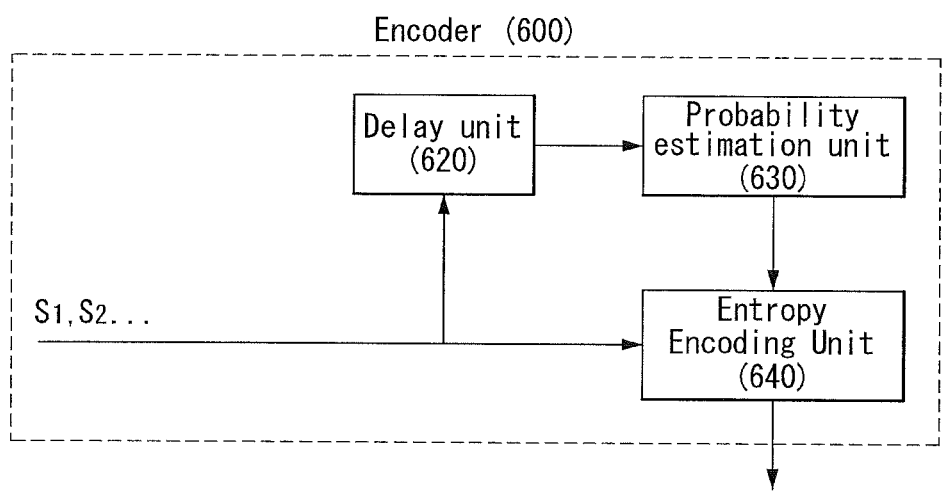

[Figure 7]
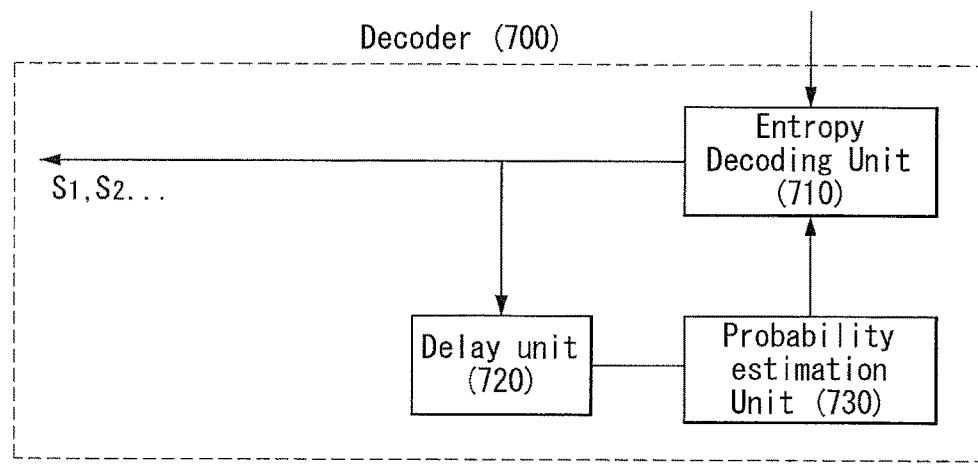

[Figure 8]

| | P-1 | P-2 | | Q+1 | Q | Q-1 | Q-2 | | Q-T | | 1 | 0 |
|---|---|---|---|---|---|---|---|---|---|---|---|---|
| $L_k$ | 0 | 0 | ... | 0 | 1 | $U_1$ | $U_2$ | ... | $U_T$ | ... | | |
| $D_k$ | 0 | 0 | ... | 0 | $V_0$ | $V_1$ | $V_2$ | ... | $V_T$ | ... | | |//
| MSB | | | | | | | | | | | | LSB |

[Figure 9]
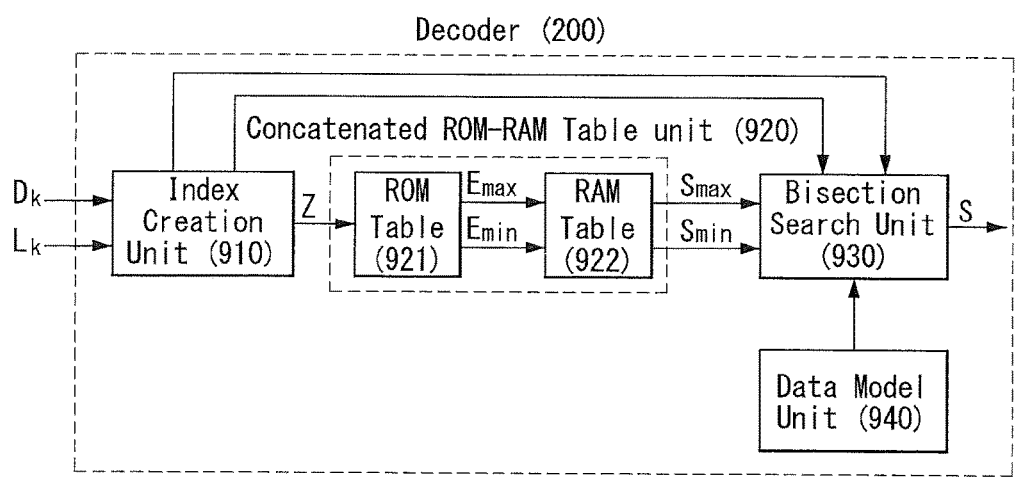

[Figure 10]
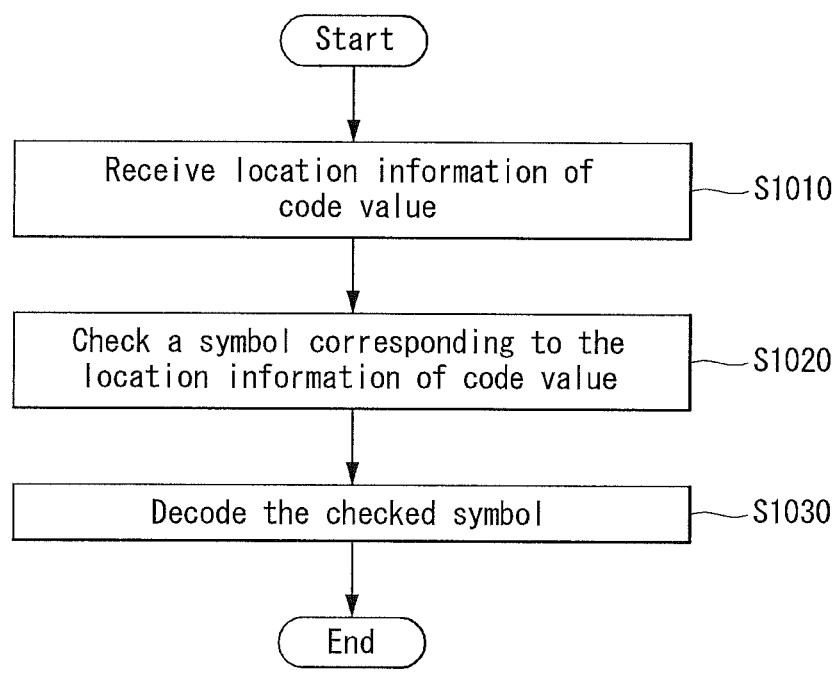

[Figure 11]
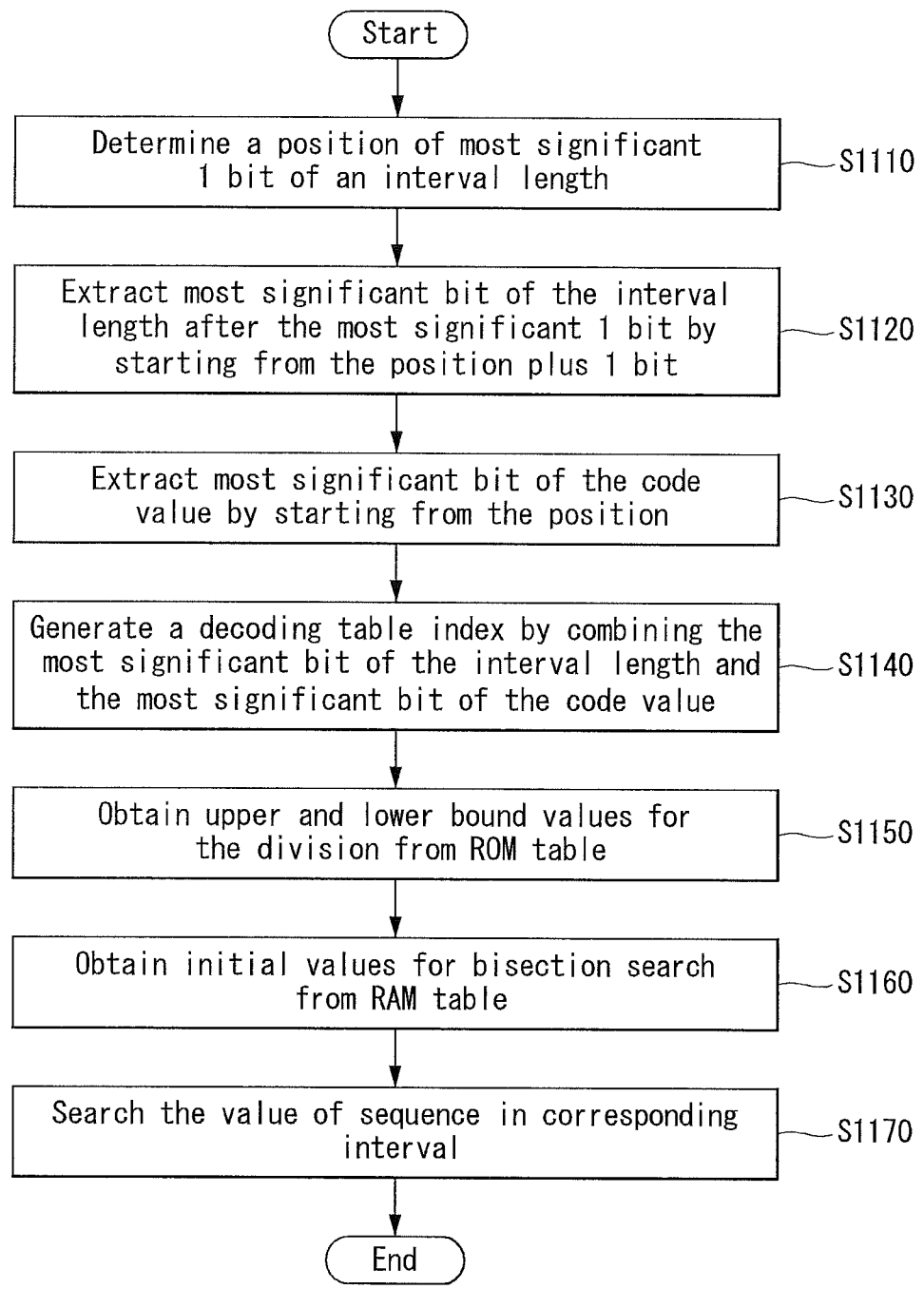

METHOD AND APPARATUS FOR PERFORMING ARITHMETIC CODING ON BASIS OF CONCATENATED ROM-RAM TABLE

CROSS-REFERENCE TO RELATED APPLICATIONS

This application is the National Stage filing under 35 U.S.C. 371 of International Application No. PCT/KR2015/006622, filed on Jun. 29, 2015, which claims the benefit of U.S. Provisional Application No. 62/018,645, filed on Jun. 29, 2014, the contents of which are all hereby incorporated by reference herein in their entirety.

TECHNICAL FIELD

The present invention relates to a method and apparatus for processing a video signal and, more particularly, to a technology for performing an arithmetic coding with a concatenated ROM-RAM table.

BACKGROUND ART

Entropy coding is the process used to optimally define the number of bits that go into a compressed data sequence. Thus, it is a fundamental component of any type of data and media compression, and strongly influences the final compression efficiency and computational complexity. Arithmetic coding is an optimal entropy coding technique, with relatively high complexity, but that has been recently widely adopted, and is part of the H.264/AVC, H.265/HEVC, VP8, and VP9 video coding standards. However, increasing demands for very-high compressed-data-throughput, by applications like UHD and high-frame-rate video, require new forms of faster entropy coding.

DISCLOSURE

Technical Problem

There is a problem in that binarization forces the sequential decomposition of all data to be coded, so it can only be made faster by higher clock speeds.

There is a problem in that narrow registers require extracting individual data bits as soon as possible to avoid losing precision, which is also a form of unavoidable serialization. There is a problem in that complicated product approximations were defined in serial form, while fast multiplications are fairly inexpensive.

There is a problem of sequentially decomposing a decoding process into binary decisions when a coder uses bisection or another form of binary-tree search, and there is a problem in that the coding system cannot improve significantly over the speed of binary arithmetic coding.

There is a problem in that the information about a symbol is defined not directly in terms of bits, but as a ratio between elements $D_k$ and $L_k$, in an arithmetic coding.

Technical Solution

An embodiment of the present invention provides a method of increasing the throughput of the arithmetic coding by using table lookup.

Furthermore, an embodiment of the present invention provides a decoder with concatenated ROM-RAM table lookup.

Furthermore, an embodiment of the present invention provides a method of replacing RAM-based table with a cascade of a large and inexpensive ROM table and a smaller RAM table.

Furthermore, an embodiment of the present invention provides a method of utilizing table lookup for division approximation.

Advantageous Effects

In accordance with the present invention, the throughput (bits processed per second) of the arithmetic coding can be increased, by using table lookup.

Furthermore, in accordance with the present invention, a decoder with concatenated ROM-RAM table lookup can enhance compression efficiency and computational complexity.

Furthermore, in accordance with the present invention, a decoder with concatenated ROM-RAM table lookup will be applicable to any form of arithmetic coding.

Furthermore, in accordance with the present invention, a decoder with concatenated ROM-RAM table lookup enables significantly faster decoding.

DESCRIPTION OF DRAWINGS

FIGS. 1 and 2 illustrate schematic block diagrams of an encoder and decoder which process a video signal in accordance with embodiments to which the present invention is applied.

FIG. 3 is a flowchart illustrating sets of operations required for updating arithmetic coding interval data.

FIGS. 4 and 5 illustrate schematic block diagrams of an encoder and decoder which process a video signal based on binary arithmetic coding in accordance with embodiments to which the present invention is applied.

FIGS. 6 and 7 illustrate schematic block diagrams of an encoder and decoder of an arithmetic coding system designed by using large data alphabets and long registers in accordance with embodiments to which the present invention is applied.

FIG. 8 shows a diagram with the binary representation of $D_k$ and $L_k$ on P-bit registers in accordance with an embodiment to which the present invention is applied.

FIG. 9 shows a schematic block diagram of arithmetic decoder with concatenated ROM-RAM tables.

FIG. 10 is a flowchart illustrating a method of decoding data symbols in accordance with an embodiment to which the present invention is applied.

FIG. 11 is a flowchart illustrating a method of performing an arithmetic decoding by using concatenated ROM-RAM tables in accordance with an embodiment to which the present invention is applied.

BEST MODE

In accordance with an aspect of the present invention, there is provided a method of performing an arithmetic decoding for data symbols, comprising: obtaining a decoding table index; retrieving an upper bound value and a lower bound value of a ratio between an interval length and a point within an interval assigned to a symbol from a ROM table; obtaining initial values for a bisection search from a RAM table based on the upper bound value and the lower bound value; and searching a value of sequence in the interval, wherein the interval is determined based on the initial values.

In another aspect of the present invention, the method further includes determining a position of most significant 1 bit of the interval length; extracting the most significant bit of the interval length after the most significant 1 bit by starting from the position plus 1 bit; and extracting the most significant bit of an interval base by starting from the position.

In another aspect of the present invention, the decoding table index is created by combining most significant bit of an interval length and most significant bit of the point within the interval assigned to the symbol.

In another aspect of the present invention, the upper bound value is determined based on a ratio between a minimum of the point within the interval assigned to the symbol and a maximum of the interval length.

In another aspect of the present invention, the lower bound value is determined based on a ratio between a minimum of the point within the interval assigned to the symbol and a maximum of the interval length.

In another aspect of the present invention, the upper bound value and the lower bound value is determined based on a bit shift corresponding to multiplication approximation.

In another aspect of the present invention, there is provided an apparatus of performing an arithmetic decoding for data symbols, comprising: an index creation unit configured to create a decoding table index; a concatenated ROM-RAM table unit configured to obtain an upper bound value and a lower bound value of a ratio between an interval length and a point within an interval assigned to a symbol from a ROM table, and obtain initial values for a bisection search from a RAM table based on the upper bound value and the lower bound value, and a bisection search unit configured to search a value of sequence in the interval, wherein the interval is determined based on the initial values.

In another aspect of the present invention, the apparatus further comprises an entropy decoding unit configured to determine a position of most significant 1 bit of the interval length, extract the most significant bit of the interval length after the most significant 1 bit by starting from the position plus 1 bit, and extract the most significant bit of the code value by starting from the position.

[Mode for Invention]

Hereinafter, exemplary elements and operations in accordance with embodiments of the present invention are described with reference to the accompanying drawings. It is however to be noted that the elements and operations of the present invention described with reference to the drawings are provided as only embodiments and the technical spirit and kernel configuration and operation of the present invention are not limited thereto.

Furthermore, terms used in this specification are common terms that are now widely used, but in special cases, terms randomly selected by the applicant are used. In such a case, the meaning of a corresponding term is clearly described in the detailed description of a corresponding part. Accordingly, it is to be noted that the present invention should not be construed as being based on only the name of a term used in a corresponding description of this specification and that the present invention should be construed by checking even the meaning of corresponding term.

Furthermore, terms used in this specification are common terms selected to describe the invention, but may be replaced with other terms for more appropriate analysis if such terms having similar meanings are present. For example, a signal, data, a sample, a picture, a frame, and a block may be properly replaced and interpreted in each coding process.

FIGS. 1 and 2 illustrate schematic block diagrams of an encoder and decoder which process a video signal in accordance with embodiments to which the present invention is applied.

The encoder 100 of FIG. 1 includes a transform unit 110, a quantization unit 120, and an entropy encoding unit 130. The decoder 200 of FIG. 2 includes an entropy decoding unit 210, a dequantization unit 220, and an inverse transform unit 230.

The encoder 100 receives a video signal and generates a prediction error by subtracting a predicted signal from the video signal.

The generated prediction error is transmitted to the transform unit 110. The transform unit 110 generates a transform coefficient by applying a transform scheme to the prediction error.

The quantization unit 120 quantizes the generated transform coefficient and sends the quantized coefficient to the entropy encoding unit 130.

The entropy encoding unit 130 performs entropy coding on the quantized signal and outputs an entropy-coded signal. In this case, the entropy coding is the process used to optimally define the number of bits that go into a compressed data sequence. Arithmetic coding, which is one of an optimal entropy coding technique, is a method of representing multiple symbols by a single real number.

The present invention defines improvements on methods to increase the throughput (bits processed per second) of the arithmetic coding technique, by using table lookup, and specifically, replacing RAM-based table with a cascade of a large and inexpensive ROM table and a smaller RAM table.

In an aspect of the present invention, the entropy encoding unit 130 may update the interval for each of the data symbols using a multiplication approximation, and calculate the multiplication approximation of products using bit-shifts and additions within the updated interval.

In the process of the calculating, the entropy encoding unit 130 may determine a position of most significant 1 bit of the length, and extract some of most significant bits of the length after the most significant 1 bit, to obtain the approximated length. In this case, the interval is updated based on the approximated length and resulting bits of the products.

The decoder 200 of FIG. 2 receives a signal output by the encoder 100 of FIG. 1.

The entropy decoding unit 210 performs entropy decoding on the received signal. For example, the entropy decoding unit 210 may receive a signal including location information of code value, check a symbol corresponding to the location information of code value, and decode the checked symbol.

In another aspect of the present invention, the entropy decoding unit 210 may generate a decoding table index by combining the most significant bit of the interval length and the most significant bit of the code value.

In this case, the most significant bit of the interval length can be extracted after the most significant 1 bit by starting from the position plus 1 bit, and the most significant bit of the code value can be extracted by starting from a position of most significant 1 bit of an interval length.

Meanwhile, the dequantization unit 220 obtains a transform coefficient from the entropy-decoded signal based on information about a quantization step size.

The inverse transform unit 230 obtains a prediction error by performing inverse transform on the transform coefficient. A reconstructed signal is generated by adding the obtained prediction error to a prediction signal.

FIG. 3 is a flowchart illustrating sets of operations required for updating arithmetic coding interval data.

The arithmetic coder to which the present invention is applied can include data source unit(310), data modeling unit(320), 1$^{st}$ delay unit(330) and 2$^{nd}$ delay unit.

The data source unit(310) can generate a sequence of N random symbols, each from an alphabet of M symbols, as the following equation 1.

$$S=\{s_1, s_2, s_3, \ldots, s_N\}, s_k \in \{0, 1, 2, \ldots, M-1\} \quad \text{[Equation 1]}$$

In this case, the present invention assumes that the data symbols are all independent and identically distributed (i.i.d.), with nonzero probabilities as the following equation 2.

$$\text{Prob}\{s_k=n\}=p(n)>0, k=1, 2, \ldots, N, n=0, 1, \ldots, M-1 \quad \text{[Equation 2]}$$

And, the present invention can define the cumulative probability distribution, as the following equation 3.

$$c(n) = \sum_{s=0}^{n-1} p(s), n = 0, 1, \ldots, M \quad \text{[Equation 3]}$$

In this case, $c(s)$ is strictly monotonic, and $c(0)=0$ and $c(M)=1$.

Even though those conditions may seem far different from what is found in actual complex media signals, in reality all entropy coding tools are based on techniques derived from those assumptions, so the present invention can provide embodiments constrained to this simpler model.

Arithmetic coding consists mainly of updating semi-open intervals in the line of real numbers, in the form $[b_k, b_k+l_k)$, where $b_k$ represents the interval base and $l_k$ represents its length. The intervals may be updated according to each data symbol $s_k$, and starting from initial conditions b1=0 and l1=1, they are recursively updated for k=1, 2, . . . , N using the following equations 4 and 5.

$$l_{k+1}=p(s_k)l_k \quad \text{[Equation 4]}$$

$$b_{k+1}=b+c(s_k)l_k \quad \text{[Equation 5]}$$

In this case, the intervals may be progressively nested, as the following equation 6.

$$[b_k,b_k+l_k) \supset [b_i,b_i+l_i), k=1, 2, \ldots, i-1, i=2, 3, \ldots, N+1 \quad \text{[Equation 6]}$$

As described above, referring to FIG. 3, the data modeling unit(320) can receive a sequence of N random symbols $S_k$, and output the cumulative probability distribution $C(S_k)$ and symbol probability $p(S_k)$.

The interval length $l_{k+1}$ can be obtained by multiplication operation of $S_k$ outputted from the data modeling unit(320) and $l_k$ outputted from 1$^{st}$ delay unit(330).

And, the interval base $b_{k+1}$ can be obtained by addition operation of $b_k$ outputted from 2$^{nd}$ delay unit(340) and the multiplication of $C(S_k)$ and $l_k$.

The arithmetic coding to which the present invention is applied can be defined by the arithmetic operations of multiplication and addition. In this case, $b_k$ and $l_k$ can be represented with infinite precision, but this is done to first introduce the notation in a version that is intuitively simple. Later the present invention provides methods for implementing arithmetic coding approximately using finite precision operations.

After the final interval $[b_{N+1}, b_{N+1}+l_{N+1})$ has been computed the arithmetic encoded message is defined by a code value $\hat{V} \in [b_{N+1}, b_{N+1}+l_{N+1})$. It can be proved that there is one such value that can be represented using at most $1+\log_2(l_{N+1})$ bits.

To decode the sequence S using code value $\hat{V}$, the present invention again starts from initial conditions $b_1=0$ and $l_1=1$, and then use the following equations 7 to 9 to progressively obtain $s_k$, $l_k$, and $b_k$.

$$s_k = \left\{ s : c(s) \leq \frac{\hat{v} - b_k}{l_k} < c(s+1) \right\} \quad \text{[Equation 7]}$$

$$l_{k+1} = p(s_k)l_k \quad \text{[Equation 8]}$$

$$b_{k+1} = b_k + c(s_k)l_k \quad \text{[Equation 9]}$$

The correctness of this decoding process can be concluded from the property that all intervals are nested, that $\hat{V} \in [b_{N+1}, b_{N+1}+l_{N+1})$, and assuming that the decoder perfectly reproduces the operations done by the encoder.

For a practical implementation of arithmetic coding, the present invention can consider that all additions are done with infinite precision, but multiplications are approximated using finite precision, in a way that preserves some properties. This specification will cover only the aspects needed for understanding this invention. For instance, interval renormalization is an essential part of practical methods, but it is not explained in this specification since it does not affect the present invention.

The present invention can use symbols $B_k$, $L_k$, and $D_k$ to represent the finite precision values (normally scaled to integer values) of $b_k$, $l_k$ and $\hat{V}-b_k$, respectively. the aspects of encoding can be defined by the following equations 10 and 11.

$$L_{k+1}=[[c(s_k+1)L_k]]-[[c(s_k)L_k]] \quad \text{[Equation 10]}$$

$$B_{k+1}=B_k+[[c(s_k)L_k]] \quad \text{[Equation 11]}$$

In this case, the double brackets surrounding the products represent that the multiplications are finite-precision approximations.

The equation 10 corresponds to equation 4 because $p(s)=c(s+1)-c(s)$ (s=1, 2, . . . , M).

Thus, the decoding process can be defined by the following equations 12 to 14.

$$S_k=\{s:[[c(s)L_k]] \leq D_k < [[c(s+1)L_k]]\} \quad \text{[Equation 12]}$$

$$L_{k+1}=[[c(s_k+1)L_k]]-[[c(s_k)L_k]] \quad \text{[Equation 13]}$$

$$B_{k+1}=B_k+[[c(s_k)L_k]] \quad \text{[Equation 14]}$$

One important aspect of arithmetic decoding is that, except in some trivial cases, there are no direct methods for finding $s_k$ in eq. (7), and some type of search is needed. For instance, since $c(s)$ is strictly monotonic the present invention can use bisection search and find $s_k$ with $O(\log_2 M)$ tests. The average search performance can be also improved by using search techniques that exploit the distribution of symbol probabilities.

FIGS. 4 and 5 illustrate schematic block diagrams of an encoder and decoder which process a video signal based on binary arithmetic coding in accordance with embodiments to which the present invention is applied.

Implementers of arithmetic coding to which the present invention has been applied can deal with the following factors.

Firstly, arithmetic operations like multiplication were relatively very expensive, so they were replaced by even rough approximations, and table-look-up approaches.

Secondly, even with elimination of products, the present invention needs processor registers to keep the intermediate results and additions. For simpler hardware implementation there were techniques developed to work with registers of only 8 or 16 bits.

Thirdly, the decoder can be much slower than the encoder because it has to implement the search of the equation (12), and this complexity increases with alphabet size M.

One form of coding that first addressed all these problems was binary arithmetic coding, which is applied to only a binary input alphabet (i.e., M=2). This is not a fundamental practical constraint, since data symbols from any alphabet can be converted to sequences of binary symbols (binarization). FIGS. 4 and 5 show an encoder and a decoder that implements this type of coding respectively.

The encoder(400) includes binarization unit(410), delay unit(420), probability estimation unit(430) and entropy encoding unit(440). And, the decoder(500) includes entropy decoding unit(510), delay unit(520), probability estimation unit(530) and aggregation unit(540).

The binarization unit(410) can receive a sequence of data symbols and output bin string consisted of binarized values 0 or 1 by performing the binarization. The outputted bin string is transmitted to probability estimation unit(430) through delay unit(420). The probability estimation unit(430) performs probability estimation for entropy-encoding.

The entropy encoding unit(440) entropy-encodes the outputted bin string and outputs compressed data bits.

The decoder(500) can perform the above encoding process reversely.

However, the coding system of FIGS. 4 and 5 can have the following problems.

Firstly, binarization forces the sequential decomposition of all data to be coded, so it can only be made faster by higher clock speeds. And, narrow registers require extracting individual data bits as soon as possible to avoid losing precision, which is also a form of unavoidable serialization.

The problem is the complexity of finding $s_k$ using equation 12. If the coding system uses bisection or another form of binary-tree search, the coding system may have the same problem of sequentially decomposing the decoding process into binary decisions, and cannot improve significantly over the speed of binary arithmetic coding.

Thus, the proposed solution will be applicable to any form of arithmetic coding, but are primarily designed for the system of FIGS. 6 and 7.

FIGS. 6 and 7 illustrate schematic block diagrams of an encoder and decoder of an arithmetic coding system designed by using large data alphabets and long registers in accordance with embodiments to which the present invention is applied.

Referring to FIGS. 6 and 7, the encoder(600) includes delay unit(620), probability estimation unit(630) and entropy encoding unit(640). And, the decoder(700) includes entropy decoding unit(710), delay unit(720) and probability estimation unit(730). In this case, the entropy encoding unit(640) can directly receive large data alphabets, and generate compressed data in binary words based on large data alphabets and long register.

For an arithmetic coding for data symbols, firstly, an entropy encoding unit(640) can create an interval for each of the data symbols. In this case, the interval is represented based on a starting point and a length of the interval.

The entropy encoding unit(640) can update the interval for each of the data symbols using a multiplication approximation. In this case, the multiplication approximation of the products can be performed by using optimization of factors including negative numbers. Furthermore, the multiplication approximation of the products can be scaled with the number of register bits.

And then, the entropy encoding unit(640) can calculate the multiplication approximation of products using bit-shifts and additions within the updated interval. In this case, the encoder can determine a position of most significant 1 bit of the length, and can extract some of most significant bits of the length after the most significant 1 bit, to obtain the approximated length. The interval can be updated based on the approximated length and resulting bits of the products.

Through the above process, the bits processed per second of the arithmetic coding can be increased, by using larger data alphabets and long registers for computation.

Furthermore, the explanation of FIGS. 4 and 5 can be similarly applied for the above functional units of the encoder(600) and the decoder(700).

FIG. 8 shows a diagram with the binary representation of $D_k$ and $L_k$ on P-bit registers in accordance with an embodiment to which the present invention is applied.

One approach that has been used to greatly accelerate the decoding of Huffman codes is to use table look-up, i.e., instead of reading one bit and moving to a new code tree node a time, several bits are read and used to create an index to a pre-computed table, which indicates the decoded symbol, how many bits to discard, or if more bits need to be read to determine the decoded symbol. This can be easily done because Huffman codes generate an integer number of bits per coded symbol, so it is always easy to define the next set of bits to be read. However, those conditions are not appropriate for arithmetic coding.

In arithmetic coding, the information about a symbol may be defined not directly in terms of bits, but as a ratio between elements $D_k$ and $L_k$.

The present invention may deal with this problem by using divisions to normalize $D_k$.

$$E = \left\lfloor \frac{K_t D_k}{L_k} \right\rfloor \qquad \text{[Equation 15]}$$

$$s_k = \left\{ s : c(s) \leq \frac{D_k}{L_k} < c(s+1) \right\} \qquad \text{[Equation 16]}$$

In equation 15, E is the quantized version of the fraction $D_k/L_k$. From E, the present invention can find initial values for the bisection search of equation 16, which can be stored in a table with $K_t$ elements, enabling significantly faster decoding. The table entries may be determined by the below equations.

$$\hat{s}_{min}(E) = \left\{ s : c(s) \leq \frac{E}{K_t} < c(s+1) \right\} \qquad \text{[Equation 17]}$$

$$\hat{s}_{max}(E) = \left\{ s : c(s) < \frac{E+1}{K_t} \leq c(s+1) \right\} \qquad \text{[Equation 18]}$$

Since $\hat{s}_{max}(E) < 32\ \hat{s}_{min}(E+1)$, one table may be enough for correct decoding. The 'one table' can be called as RAM table since it should be stored in the RAM to be periodically updated. The overhead of computing the table each time the model is updated can be small because table look-up is only for initializing the bisection search.

One constraint for table look-up decoding is that on low-complexity hardware platforms divisions can be prohibitively expensive, even for 32-bit registers.

Accordingly, in an aspect of the present invention, table-based decoding method will be explained, and the present invention provides a method to use table lookup for division approximation. The present invention may define a special subset of bits to be extracted from both $D_k$ and $L_k$ to create a table index, and having the table elements inform the range of symbols that needs to be further searched, not directly, but as worst case.

Hereinafter, it will be explained how this approach works by describing how to create the table indexes and entries.

The present invention can use the following equation 19 to check that ratios between $D_k$ and $L_k$ may be defined mostly by the most significant nonzero bits of their representation.

$$0 \leq \hat{v} - b_k < l_k \Rightarrow 0 \leq D_k < L_k \qquad \text{[Equation 19]}$$

Referring to FIG. 8, it shows the binary representation of $D_k$ and $L_k$, stored as P bit integers. The present invention can use fast processor operations to identify the position Q of the most significant 1-bit of $L_k$. With that, the present invention may extract T bits $u_1 u_2 \ldots u_T$ from $L_k$, and T+1 bits $v_0 v_1 v_2 \ldots v_T$ from $D_k$, as shown in FIG. 8. Those bits may be used to create the integer Z, with binary representation $u_1 u_2 \ldots u_T v_0 v_1 v_2 \ldots v_T$, which will be used as the index to a decoding table with $2^{2T+1}$ entries.

Given bit position Q, upper and lower bound values for the division $(D_k/L_k)$ may be defined as equation 20.

$$E_{min} \leq \frac{D_k}{L_k} < E_{max} \qquad \text{[Equation 20]}$$

In this case, $E_{min}$ means upper bound value of the division $(D_k/L_k)$ and means lower bound value of the division $(D_k/L_k)$. For example, $E_{min}$ can be defined as $[D_{min}/L_{max}]$, and $E_{max}$ can be defined as $[D_{max}/L_{min}]$. Thus, $E_{min}$ and $E_{max}$ can be represented as equation 21 and 22.

$$\frac{D_{min}}{L_{max}} = \frac{\sum_{n=0}^{T} v_n 2^{Q-n}}{(2^Q + \sum_{n=1}^{T} u_n 2^{Q-n}) 2^{-a}} = \frac{(1 + \sum_{n=0}^{T} v_n 2^{T-n}) 2^a}{2^T + \sum_{n=1}^{T} u_n 2^{T-n}} \qquad \text{[Equation 21]}$$

$$\frac{D_{max}}{L_{min}} = \qquad \text{[Equation 22]}$$

$$\frac{2^{Q-T} + \sum_{n=0}^{T} v_n 2^{Q-n}}{(2^{Q-T} + 2^Q + \sum_{n=1}^{T} u_n 2^{Q-n})^{2-a}} = \frac{(\sum_{n=0}^{T} v_n 2^{T-n}) 2^a}{1 + 2^T + \sum_{n=1}^{T} u_n 2^{T-n}}$$

In this case, 'a' represents the bit shift corresponding to the multiplication approximation. With those values as index to RAM-table, the initial values for the bisection search may be retrieved as equations 23 and 24.

$$\hat{s}_{min}(E_{min}) = \left\{ s : c(s) \leq \frac{E_{min}}{K_t} < c(s+1) \right\} \qquad \text{[Equation 23]}$$

$$\hat{s}_{max}(E_{max}) = \left\{ s : c(s) < \frac{E_{max} + 1}{K_t} \leq c(s+1) \right\} \qquad \text{[Equation 24]}$$

Accordingly, the present invention can provide the symbol decoding process, as follows.

The decoder can determine the bit position Q of the most significant 1-bit of $L_k$, and starting from bit position Q+1, extract the T most significant bits of $L_k$. And, starting from bit position Q, the decoder can extract the T+1 most significant bits of $D_k$.

Then, the decoder can combine the 2T+1 bits to form table index Z. The decoder may retrieve $E_{min}$ and $E_{max}$ from the table, and search only in the interval $[s_{min}(Z), s_{max}(Z)]$ the value of s that satisfies the following equation 25.

$$[[c(s)L_k]] \leq D_k < [[c(s+1)L_k]] \qquad \text{[Equation 25]}$$

FIG. 9 shows a schematic block diagram of arithmetic decoder with concatenated ROM-RAM tables.

The decoder to which the present invention is applied includes index creation unit 910, concatenated ROM-RAM table unit 920, bisection search unit 930 and data model unit 940. The concatenated ROM-RAM table unit 920 includes ROM table 921 and RAM table 922.

The index creation unit 910 may receive $D_k$ and $L_K$ and extract a specific set of bits from $D_k$ and $L_K$. And, the index creation unit 910 may create an index Z for decoding table based on the specific set of bits. In this case, the index Z may be formed based on the T most significant bits of $L_K$ and the T+1 most significant bits of $D_k$.

The created index Z can be transmitted to the concatenated ROM-RAM table unit 920. The transmitted index Z can be stored in ROM table 921 of the concatenated ROM-RAM table unit 920. The upper and lower bounds of the division $(D_k/L_k)$, $E_{max}$ and $E_{min}$, may be retrieved from ROM table 921, and be transmitted to RAM table 922. For example, $E_{max}$ and $E_{min}$ may be obtained based on equations 21 and 22.

The RAM table 922 may receive $E_{max}$ and $E_{min}$ from the ROM table 921, and output initial values for the bisection search. With those values as index to RAM table, the initial values for the bisection search, $S_{max}$ and $S_{min}$ may be retrieved. In this case, equations 23 and 24 can be used.

The bisection search unit 930 may search the value of s only in the corresponding interval $[S_{min}(E_{min}), S_{max}(E_{max})]$, and output the value of s. In this case, the value of s satisfies equation 25.

Clearly, larger tables will allow better approximation, and for sufficiently large tables we will have $E_{min} = E_{max}$, meaning that they can narrow down the search range as effective as the actual division value.

The concatenated ROM-RAM table can be called as ROM table since it does not requires updating and can be stored in a ROM. Furthermore, if the number of entries in the RAM table is known, only the corresponding most significant bits of $E_{min}$ and $E_{max}$ need to be stored. For example, if the number of entries in RAM-table is 256, then storing 8 most significant bits of $E_{min}$ and $E_{max}$ is sufficient.

FIG. 10 is a flowchart illustrating a method of decoding data symbols in accordance with an embodiment to which the present invention is applied.

The decoder to which the present invention is applied can receive a bitstream including location information of code value (S1010).

For example, the location information may include at least one of an initial range and interval information.

And, the decoder can check a symbol corresponding to the location information of code value(S1020), and decode the checked symbol(S1030).

At this time, a range can be divided according to a probability of each of symbols, and the decoder may decode symbols by checking which symbol is included within the divided range.

FIG. 11 is a flowchart illustrating a method of performing an arithmetic decoding by using concatenated ROM-RAM tables in accordance with an embodiment to which the present invention is applied.

The decoder to which the present invention is applied may determine a position of most significant 1 bit of an interval length (S1110).

And, the decoder may extract most significant bit of the interval length after the most significant 1 bit by starting from the position plus 1 bit (S1120), and extract most significant bit of the code value by starting from the position (S1130).

And then, the decoder may generate a decoding table index by combining the most significant bit of the interval length and the most significant bit of the code value (S1140).

The decoder may obtain upper and lower bound values for the division from ROM table (S1150), and obtain initial values for bisection search from RAM table based on the upper and lower bound values (S1160). In this case, the concatenated ROM-RAM table may be used in the process of S1150 and S1160.

Then, the decoder may search the value of sequence in corresponding interval (S1170).

As described above, the embodiments explained in the present invention may be implemented and performed on a processor, a micro processor, a controller or a chip. For example, functional units explained in FIGS. 1-7 and 9 may be implemented and performed on a computer, a processor, a micro processor, a controller or a chip.

Furthermore, the decoder and the encoder to which the present invention is applied may be included in a multimedia broadcasting transmission/reception apparatus, a mobile communication terminal, a home cinema video apparatus, a digital cinema video apparatus, a surveillance camera, a video chatting apparatus, a real-time communication apparatus, such as video communication, a mobile streaming apparatus, a storage medium, a camcorder, a VoD service providing apparatus, an Internet streaming service providing apparatus, a three-dimensional (3D) video apparatus, a teleconference video apparatus, and a medical video apparatus and may be used to process video signals and data signals.

Furthermore, the processing method to which the present invention is applied may be produced in the form of a program that is to be executed by a computer and may be stored in a computer-readable recording medium. Multimedia data having a data structure according to the present invention may also be stored in computer-readable recording media. The computer-readable recording media include all types of storage devices in which data readable by a computer system is stored. The computer-readable recording media may include a BD, a USB, ROM, RAM, CD-ROM, a magnetic tape, a floppy disk, and an optical data storage device, for example. Furthermore, the computer-readable recording media includes media implemented in the form of carrier waves (e.g., transmission through the Internet). Furthermore, a bit stream generated by the encoding method may be stored in a computer-readable recording medium or may be transmitted over wired/wireless communication networks.

INDUSTRIAL APPLICABILITY

The exemplary embodiments of the present invention have been disclosed for illustrative purposes, and those skilled in the art may improve, change, replace, or add various other embodiments within the technical spirit and scope of the present invention disclosed in the attached claims.

The invention claimed is:

1. A method of performing an arithmetic decoding for a data symbol that is defined by a ratio ($D_k/L_k$) between an interval length and a point within an interval assigned to the data symbol, comprising:

creating, by a processor, a decoding table index by:
combining, by the processor, a most significant bit of the interval length and a most significant bit of the point within the interval assigned to the data symbol;
determining, by the processor, a position of a most significant 1 bit of the interval length;
extracting, by the processor, a most significant bit of the interval length after the most significant 1 bit by starting from the position plus 1 bit; and
extracting, by the processor, a most significant bit of an interval base by starting from the position;
obtaining, by the processor, an upper bound value ($E_{max}$) and a lower bound value ($E_{min}$) of the ratio ($D_k/L_k$) from a decoding table stored in a ROM;
obtaining, by the processor, initial values for a bisection search from a RAM table based on the upper bound value and the lower bound value; and
decoding, by the processor, the data symbol in the interval,
wherein the interval is determined based on the initial values.

2. The method of claim 1, wherein the upper bound value is determined based on a ratio between a maximum of the point within the interval assigned to the data symbol and a minimum of the interval length.

3. The method of claim 1, wherein the lower bound value is determined based on a ratio between a minimum of the point within the interval assigned to the data symbol and a maximum of the interval length.

4. The method of claim 1, wherein the upper bound value and the lower bound value is determined based on a bit shift corresponding to multiplication approximation.

5. An apparatus of performing an arithmetic decoding for a data symbol which is defined by a ratio ($D_k/L_k$) between an interval length and a point within an interval assigned to the data symbol, comprising:

a processor configured to:
create a decoding table index by combining a most significant bit of the interval length and a most significant bit of the point within the interval assigned to the data symbol;
determine a position of a most significant 1 bit of the interval length;
extract a most significant bit of the interval length after the most significant 1 bit by starting from the position plus 1 bit;
extract a most significant bit of an interval base by starting from the position;
obtain an upper bound value and a lower bound value of ratio ($D_k/L_k$) from a decoding table stored in ROM, and obtain initial values for a bisection search from a decoding table stored in a RAM based on the upper bound value and the lower bound value;
search a value of sequence in the interval; and
decode the data symbol corresponding to the value of sequence,
wherein the interval is determined based on the initial values.

6. The apparatus of claim 5, wherein the upper bound value is determined based on a ratio between a maximum of the point within the interval assigned to the data symbol and a minimum of the interval length.

7. The apparatus of claim 5, wherein the lower bound value is determined based on a ratio between a minimum of the point within the interval assigned to the data symbol and a maximum of the interval length.

8. The apparatus of claim 5, wherein the upper bound value and the lower bound value is determined based on a bit shift corresponding to multiplication approximation.

* * * * *